United States Patent
Shen et al.

(10) Patent No.: US 7,313,029 B2
(45) Date of Patent: Dec. 25, 2007

(54) METHOD FOR ERASING FLASH MEMORIES AND RELATED SYSTEM THEREOF

(75) Inventors: Shin-Jang Shen, Hsinchu (TW); Fu-Chia Shone, HsinChu (TW)

(73) Assignee: Skymedi Corporation, Hsinchu (TW)

( * ) Notice: Subject to any disclaimer, the term of this patent is extended or adjusted under 35 U.S.C. 154(b) by 0 days.

(21) Appl. No.: 11/278,964

(22) Filed: Apr. 7, 2006

(65) Prior Publication Data
US 2007/0242525 A1   Oct. 18, 2007

(51) Int. Cl.
*G11C 16/04* (2006.01)
(52) U.S. Cl. .................... 365/185.29; 365/185.23; 365/185.27
(58) Field of Classification Search .......... 365/185.29, 365/185.28, 185.18, 185.23, 185.24, 189.09, 365/226, 185.27
See application file for complete search history.

(56) References Cited

U.S. PATENT DOCUMENTS 5,747,849 A * 5/1998 Kuroda et al. ............. 257/321
5,828,600 A * 10/1998 Kato et al. ............ 365/185.11

* cited by examiner

*Primary Examiner*—Gene N. Auduong
(74) *Attorney, Agent, or Firm*—Winston Hsu (57) ABSTRACT

A method for erasing data of a flash memory is disclosed. The flash memory includes a plurality of memory cells coupled to a word line, where each of the memory cells has a substrate, an isolated carrier storage layer, and a control gate coupled to the word line. And the method includes: coupling the substrate to a first voltage to increase a voltage level of the substrate; before erasing data, floating the control gate to make a voltage level of the control gate increase with the voltage level of the substrate; and coupling the control gate to a second voltage via the word line to discharge charges on the isolated carrier storage layer for erasing data.

43 Claims, 5 Drawing Sheets

METHOD FOR ERASING FLASH MEMORIES AND RELATED SYSTEM THEREOF

BACKGROUND OF THE INVENTION

1. Field of the Invention

The invention relates to flash memories, and more particularly, to an improved method for erasing flash memories and related system thereof.

2. Description of the Prior Art

Flash memory is a memory device that allows multiple data writing, reading, and erasing operations. In addition, the stored data will be retained by the flash memory even after power to the device is removed. With these advantages, the utilization of flash memory has been broadly applied in personal computer and electronic equipment.

Figure 1:
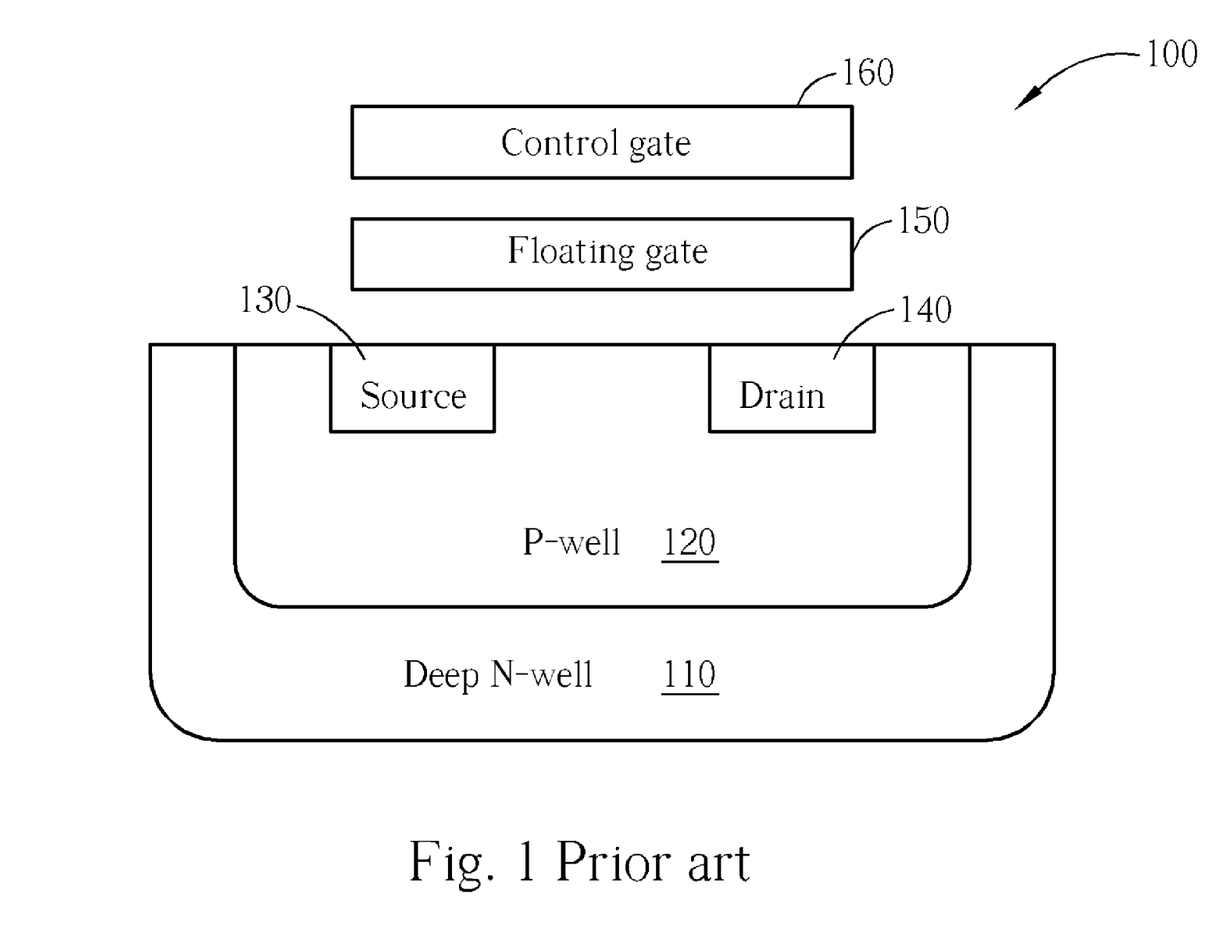
FIG. 1 is a schematic cross-section diagram of a conventional flash memory cell.

Please refer to FIG. 1, which is a schematic cross-section diagram of a conventional flash memory cell 100. As shown in FIG. 1, the flash memory cell 100 comprises a deep N-well region 110, a P-well region 120, a source region 130, a drain region 140, a floating gate 150, and a control gate 160. Generally speaking, the floating gate 150 and the control gate 160 can be fabricated using doped polysilicon. The control gate 160 is set up above the floating gate 150 with an inter-gate dielectric layer (not shown) separating the two gates. Furthermore, a tunneling oxide layer (not shown) is also setup between the floating gate and an underlying substrate (the so-called stack gate flash memory).

To write data into the flash memory cell 100, a bias voltage is applied to the control gate 160 and the source/drain regions 130/140 so that an electric field is set up to inject electrons into the floating gate 150. On the other hand, to read data from the flash memory cell 100, an operating voltage is applied to the control gate 160. Since the entrapment of charges inside the floating gate 150 will directly affect the opening or closing of the underlying channel between the source region 130 and the drain region 140, the opening or closing of the channel can be construed as a digital value of "1" or "0". Finally, to erase data from the flash memory 100, the relative potential between the P-well region 120 and the control gate 160 is raised. Hence, a tunneling effect can be utilized to transfer electrons from the floating gate to the P-well region 120 via the tunneling oxide layer or from the floating gate to the control gate via the inter-gate dielectric layer.

Figure 2:
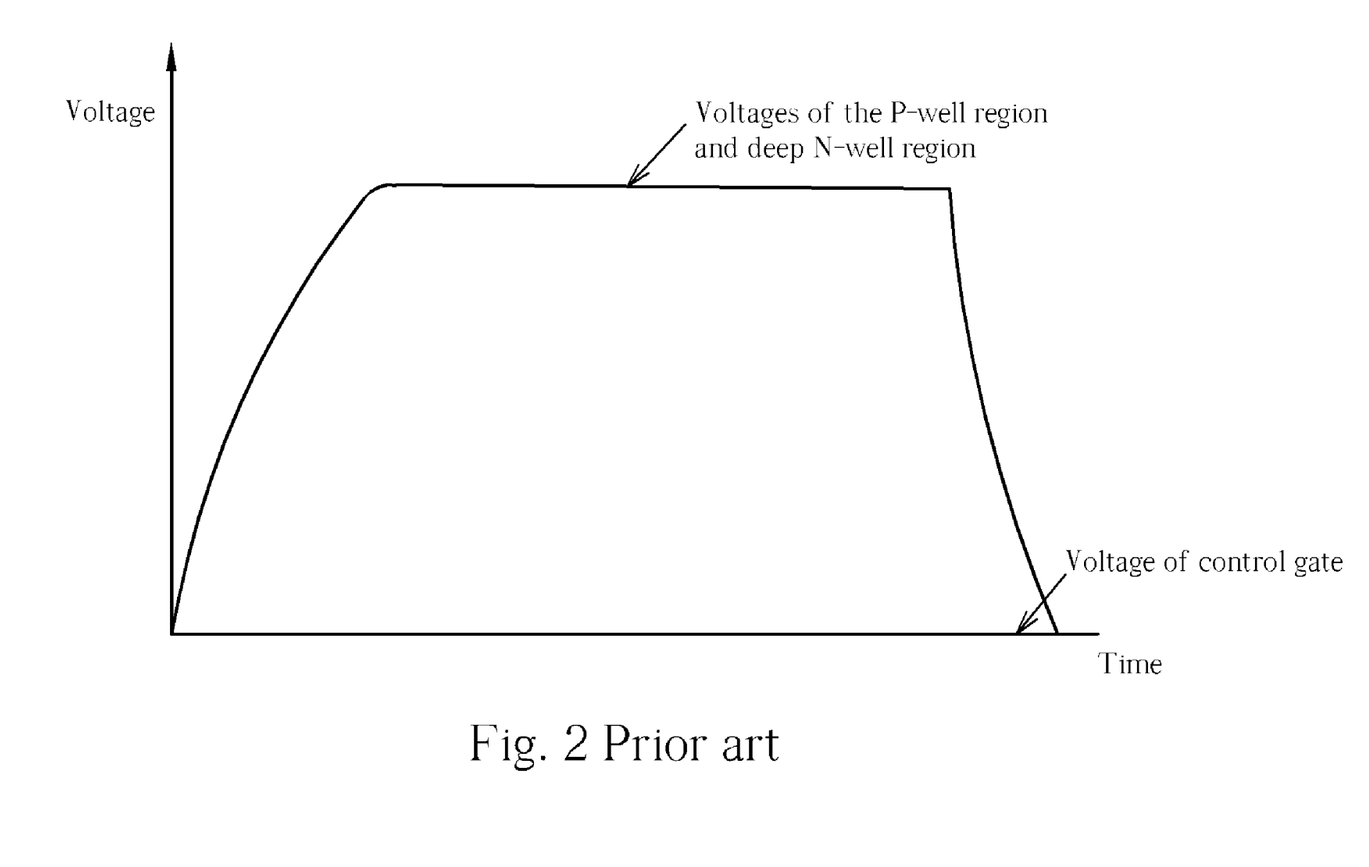
FIG. 2 is a diagram of the voltages of the P-well region/ deep N-well region and the control gate according to the prior art.

Please refer to FIG. 2, which is a diagram of the voltages of the P-well region/deep N-well region 120/110 and the control gate 160 according to the prior art. As shown in FIG. 2, when the erase operation is performed, the P-well region 120 and the deep N-well region 110 are coupled to a high voltage, and the control gate 160 is coupled to a ground voltage. The voltage difference between the voltage of the P-well region 120 and the voltage of the control gate 160 is the erase voltage. That is, if the erase voltage is large enough to trigger the tunneling effect, the erasing operation starts. Therefore, in FIG. 2, when the erase voltage is not large enough, the entire flash memory cell is in a setup time, and when the erase voltage is large enough, the entire flash memory cell is in an erase time. In general, a controlling circuit (e.g., state machine) is often utilized to control the start time of the setup time and the ending of the erase time by coupling the voltages of the P-well and deep N-well to a high voltage or a ground voltage.

However, a problem exists in that the controlling circuit (i.e., state machine) cannot determine the definite timing when the erase operation starts. As mentioned previously, the erasing operation starts as long as the erase voltage is large enough. But the erase voltage may be influenced by a lot of factors (for example, the environments of different flash memory, the array loading, or the high voltage power source), this may cause the flash memory cell 100 to be erased too much or not enough so that a following writing operation or a reading operation cannot be performed correctly because the threshold voltage of the flash memory cell 100 depends on the erasing degree, and the current is controlled by the threshold voltage, the reading operation and writing operation is influenced.

In addition, when the erasing operation is performed completely, the voltages of the Deep N-well and P-well are both discharged. Furthermore, when a next erasing operation starts, the voltages of the Deep N-well and P-well must be charged again. However, if the operation of charging the voltages of the Deep N-well and P-well must be performed for every erasing operation, then a lot of time and additional power are consumed.

Furthermore, as is known, a plurality of memory cells is arranged in an array. For example, a flash memory comprises a plurality of memory blocks, where each memory block comprises the above-mentioned flash memory cells 100. Please note that the control gate of each flash memory cell 100 is coupled to a word line. Therefore, in the above disclosure, the control gate is coupled to a ground voltage (or a high voltage) via the word line.

Except for the flash memory cells 100, each memory block often comprises multiple dummy cells. The multiple dummy cells are formed on both sides of the memory block. Dummy cells, as the name implies, are utilized as fake flash memory cells. Because the edge of the memory block often encounters different environments from those of the inner memory cells inside the memory block, the dummy cells generate currents when other memory cells are being read. In other words, even the dummy word line (the dummy word line is a word line coupled to the dummy cells) is not biased; the dummy cells still output currents such that the bit line corresponding to each dummy cell has current. Obviously, this influences the reading operation of the entire flash memory.

In the prior art, a programming (i.e., writing) operation is performed on each dummy cell after each erasing operation in order to prevent the dummy cell from being over-erased. However, it needs a few program/erase cycles to do the task. However, the programming procedure is not simple. That is, it still needs a few steps Therefore, we need a better method to solve the problem.

SUMMARY OF THE INVENTION

It is therefore one of primary objectives of the claimed invention to provide an improved method for erasing flash memories and related system thereof, to solve the above-mentioned problem.

According to an exemplary embodiment of the claimed invention, a method for erasing data of a flash memory is disclosed. The flash memory comprising a plurality of memory cells coupled to a word line, each of the memory cells having a substrate, an isolated carrier storage layer, and a control gate coupled to the word line, the method comprising: coupling the substrate to a first voltage to increase a voltage level of the substrate; before erasing data, floating the control gate to make a voltage level of the control gate increase with the voltage level of the substrate; and coupling the control gate to a second voltage via the word line to discharge charges on the isolated carrier storage layer, for erasing data.

According to another exemplary embodiment of the claimed invention, a method for erasing data of a flash memory is disclosed. The flash memory comprising a plurality of memory cells coupled to a word line, each of the memory cells has a substrate, an isolated carrier storage layer,and a control gate coupled to the word line, the substrate comprising a first well and a second well formed inside the first well, and the method comprising: coupling the second well to a first voltage; coupling the first well to a second voltage; and after erasing data, coupling the second well to a third voltage and floating the first well.

According to another exemplary embodiment of the claimed invention, a method for erasing data of a flash memory is disclosed. The flash memory comprising a plurality of memory cells coupled to a word line, each of the memory cells has a substrate, an isolated carrier storage layer, and a control gate coupled to the word line, the flash memory further comprising at least a dummy cell formed in a memory block in which the memory cells are formed, the dummy cell has a substrate, an isolated carrier storage layer, and a control gate coupled to a dummy word line, and the method comprising: coupling the substrate of the dummy cell to a first voltage to increase a voltage level of the substrate of the dummy cell; before erasing data of the memory cells, coupling the control gate of the dummy cell to a second voltage via the dummy word line; and after erasing data of the memory cells, maintaining a voltage level of the control gate of the dummy cell at the second voltage for a predetermined period and then coupling the control gate of the dummy cell to a third voltage via the dummy word line.

A system for erasing data of a flash memory, wherein the flash memory comprises a plurality of memory cells coupled to a word line, each of the memory cells having a substrate, an isolated carrier storage layer,and a control gate coupled to the word line, the system comprises: a substrate driving circuit, for controlling a voltage level of the substrate; a word line driving circuit, for controlling a voltage level of the control gate; and a controlling circuit, coupled to the word line driving circuit and the substrate driving circuit, for controlling the substrate driving circuit to couple the substrate to a first voltage in order to increase the voltage level of the substrate, for disconnecting the word line driving circuit and the word line to float the control gate such that the voltage level of the control gate increase with the voltage level of the substrate before the data begins to be erased, for coupling the word line driving circuit and the word line when the data are being erased, and for controlling the word line driving circuit to couple the control gate to a second voltage via the word line such that charges on the isolated carrier storage layer are discharged to erase data.

A system for erasing data of a flash memory, wherein the flash memory comprises a plurality of memory cells coupled to a word line, each of the memory cells having a substrate, an isolated carrier storage layer, and a control gate coupled to the word line, the substrate comprising a first well and a second well formed inside the first well, the system comprises: a substrate driving circuit comprising: a first well driving circuit, coupled to the first well, for controlling a voltage level of the first well of the substrate; and a second well driving circuit, coupled to the second well, for controlling a voltage level of the second well of the substrate; and a controlling circuit, coupled to the first well driving circuit and the second well driving circuit, for controlling the first well driving circuit to couple the first well to a first voltage, for controlling the second well driving circuit to couple the second well to a second voltage, and for controlling the second well driving circuit to couple the second well to a third voltage and controlling the first well driving circuit to float the first well after erasing data.

A system for erasing data of a flash memory, wherein the flash memory comprises a plurality of memory cells, and at least a dummy cell formed in a memory block in which the memory cells are formed, the dummy cell having a substrate, an isolated carrier storage layer,and a control gate coupled to the dummy word line, the system comprises: a substrate driving circuit for controlling a voltage level of the substrate; a dummy word line driving circuit, coupled to the dummy word line, for controlling a voltage level of the dummy word line; and a controlling circuit, coupled to the substrate driving circuit and the dummy word line driving circuit, for controlling the substrate driving circuit to couple the substrate of the dummy cell to a first voltage to increase a voltage level of the substrate of the dummy cell, controlling the dummy word line driving circuit to couple the control gate of the dummy cell to a second voltage via the dummy word line, and controlling the dummy word line driving circuit to maintain the voltage level of the control gate of the dummy cell at the second voltage for a predetermined period and then to couple the control gate of the dummy cell to a third voltage after data of the memory cells are erased.

The present invention can determine the definite time of erasing the flash memory, save power for a next erasing procedure, and save time and power to program the dummy cells. Therefore, the present invention undoubtedly has more advantages than the prior art.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
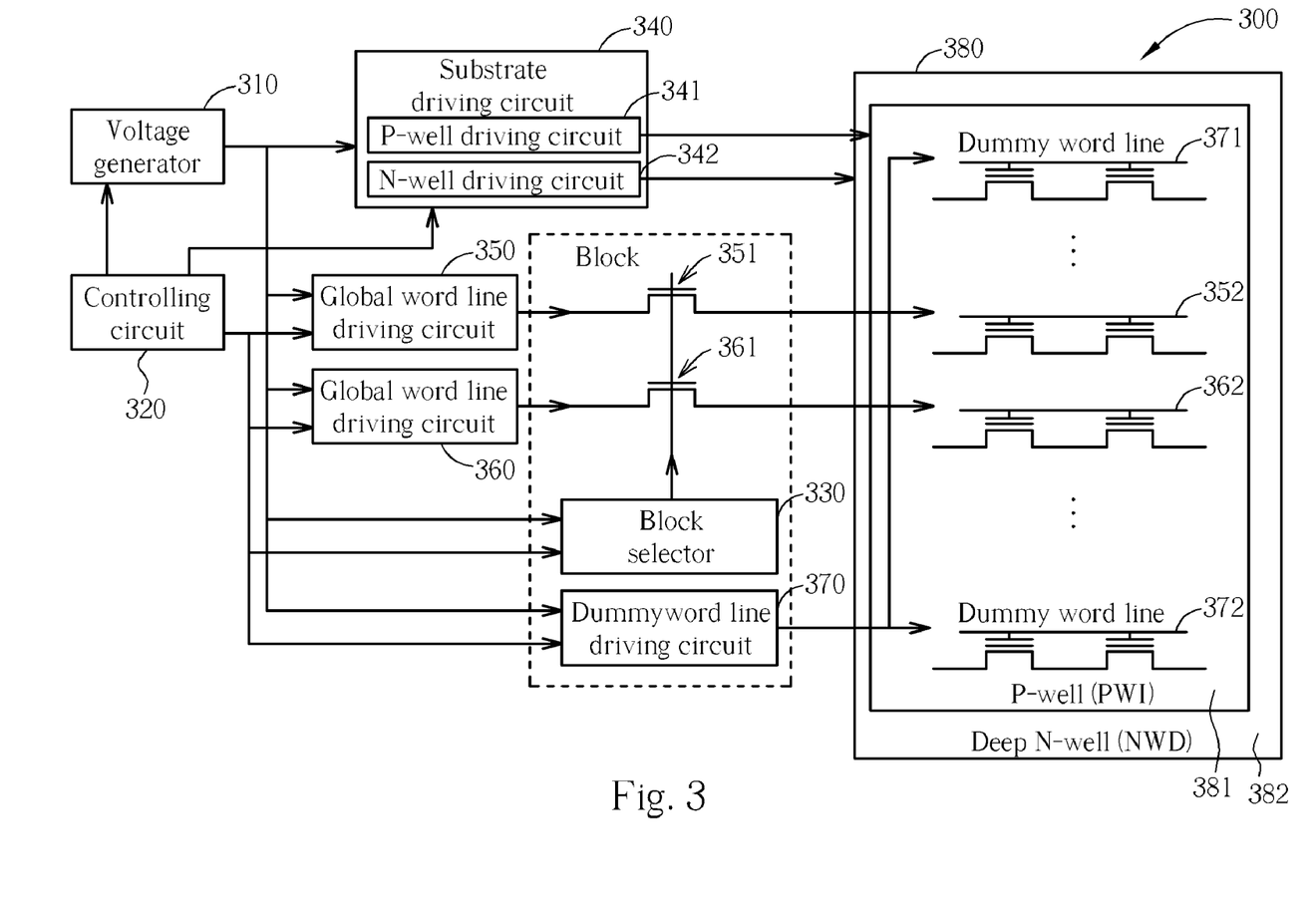
FIG. 3 is a system of erasing flash memory cells according to the present invention.

Please refer to FIG. 3, which is a system 300 according to the present invention. As shown in FIG. 3, the system 300 comprises a voltage generator 310, a controlling circuit 320, a block selector 330, a substrate driving circuit 340, a global word line driving circuits 350 and 360, a dummy word line driving circuit 370, and a flash memory block 380. The controlling circuit 320 is coupled to the voltage generator 310, the block selector 330, the substrate driving circuit 340, the global word line driving circuits 350 and 360, and the dummy word line driving circuit 370. Furthermore, the substrate driving circuit 340 comprises a P-well driving circuit 341 coupled to the P-well 381 of the memory block 380, and a N-well driving circuit 342 coupled to the deep N-well 382 of the memory block 380. The global word line driving circuits 350 and 360 are respectively coupled to word lines 352 and 362 of the memory blocks 380 through switches 351 and 361. The switches 351 and 361 are controlled by the block selector 330. The dummy word line driving circuit 370 is coupled to dummy word line 371 and 372, which are coupled to a plurality of dummy cells. In addition, as is known, each word line 352 and 362 is coupled to control gates of a plurality of memory cells. Please note, a flash memory comprises multiple memory blocks and each memory block comprises a plurality of memory cells. Here, only one memory block 380 is shown, and the only two word lines 352 and 362 are shown for simplicity. The operation of the system 300 will be illustrated in the following disclosure.

Figure 4:
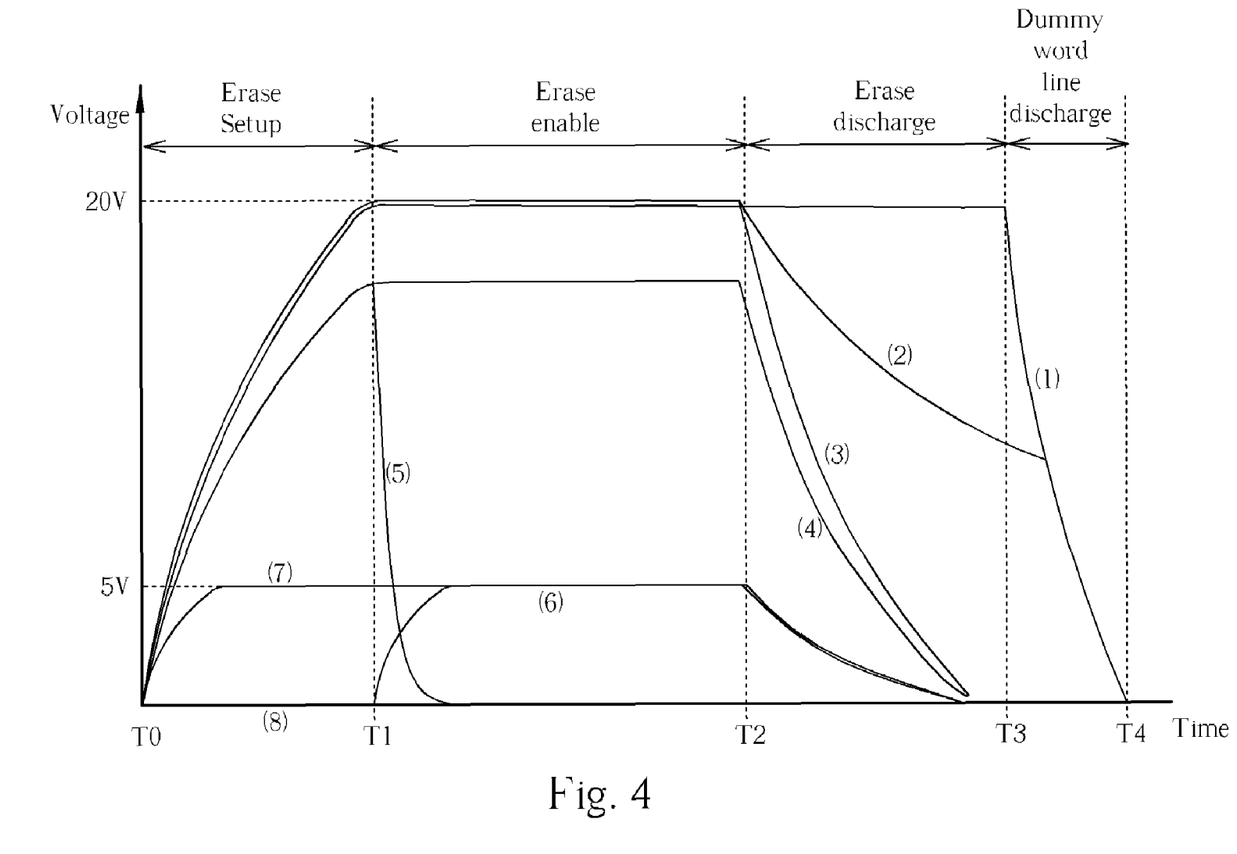
FIG. 4 is a diagram of voltage curves of each word line, global word line, dummy word line, and the substrate shown in FIG. 3.

Please refer to FIG. 4 and FIG. 5 in conjunction with FIG. 1. FIG. 4 is a diagram of voltage curves of each word line, global word line, dummy word line, and the substrate shown in FIG. 3. As shown in FIG. 4, the horizontal axis represents the time, and the vertical axis represents the voltage level. Furthermore, the curve (1) shows the voltage of dummy cell word line 371 and 372, the curve (2) shows the voltage of the deep N-well region 382, the curve (3) shows the voltage of the P-well region 381, the curve (4) shows the voltage of the word line 362, the curve (5) shows the voltage of the word line 352, the curve (6) shows the voltage of the block selector 330, the curve (7) shows the voltage of the global word line driving circuit 350, and curve (8) shows the voltage of the global word line driving circuit 360.

Figure 5:
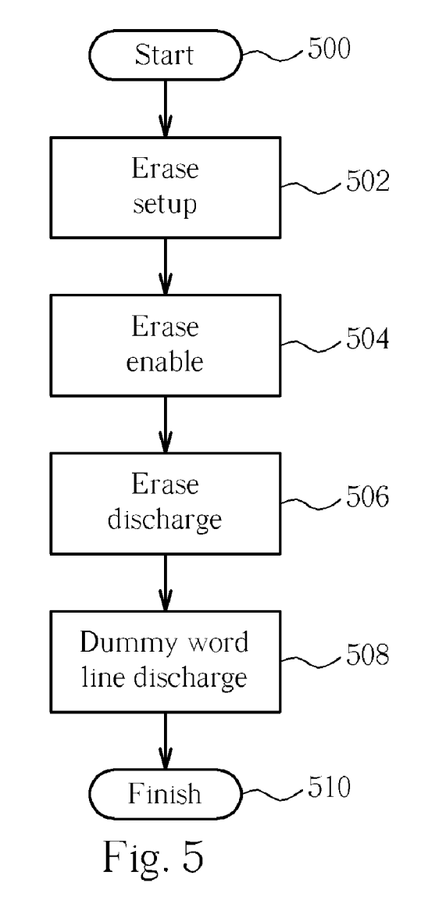
FIG. 5 is a flow chart illustrating the system erasing the data of the flash memory block.

FIG. 5 is a flow chart illustrating the system 300 erases the data of the flash memory block 360. The flow comprising the following steps:
Step 500: Start;
Step 502: Erase setup;
Step 504: Erase enable;
Step 506: Erase discharge;
Step 508: Discharge Dummy word lines.
Step 510: Finish First, before the erasing operation, the system 300 are disabled. Therefore, all voltages correspond to 0V at time T0 (step 500). In this embodiment, we assume memory cells coupled to the word line 352 will be erased, and the memory cells coupled to the word line 362 will not be erased.

After the time T0, the entire system 300 starts to perform the erasing operation. First, the system 300 is in a setup procedure (step 502). At this time, the voltage generator 310 generates different voltage levels, for example, 20V and 5V. In this embodiment, the controlling circuit 320 controls the substrate driving circuit 340 to couple the substrate (including the P-well 381 and N-well 382) to a high voltage (such as the above-mentioned 20V).

Therefore, the voltage level of the substrate is pulled up as shown in curve (2) and curve (3). In addition, in the setup procedure, the block selector 330 is not yet enabled, therefore, the switches 351 and 361 are both turned off such that the voltages of the word lines 352 and 362 are floating. Therefore, the voltages of word lines 352 and 362 are pulled up by the voltage of the substrate as shown in the curves (4) and (5). Moreover, the controlling circuit 320 also controls the global word line driving circuits 350 and 360 to respectively correspond to 5V and 0V as shown in the curves (7) and (8).

Until the time T1, the system 300 is in an enable procedure. At this time, the block selector 330 is enabled and the controlling circuit 320 controls the block selector 330 to correspond to 5V. Please note that in this embodiment, each of the switches 351 and 361 is implemented by an NMOS. The block selector 330 biases 5V on the gates of the switches 351 and 361 and the global word line driving circuit 350 outputs 0V on the source (drain) of the switch 351 such that the switch 351 is tuned on. On the other hand, the global word line driving circuit 360 outputs 5V on the source (drain) of the switch 361 such that the switch 361 is turned off.

Therefore, the word line 362 remains floating because the switch 361 is turned off. However, the global word line driving circuit 350 is coupled to the word line 352 through the switch 351. Please note that the global word line driving circuit 350 corresponds to 0V, so the word line 352 is pulled down to 0V. In addition, the voltage of the substrate still corresponds to 20V in the enable procedure. Therefore, the voltage difference between the word line 352 and the substrate is about 20V. The voltage difference is the above-mentioned erase voltage. Furthermore, because the word line 352 is coupled to control gates of each memory cell and the erase voltage is sufficiently high, charges stored in the floating gate are being removed in the enable procedure. In other words, the data stored in the memory cells coupled to the word line 352 are being erased in the enable procedure. In addition, the controlling circuit 320 also controls the dummy word line driving circuit 360 to couple the dummy word lines 371 and 372 to the high voltage 20V.

Please note that the voltage of word line 352 is floating in the setup procedure, and then is controlled by the controlling circuit 320 to be coupled to the ground voltage 0V at time T1. Therefore, if the voltage of the word line 352 is pulled down very quickly, the data almost start to be erased at time T1. That is, the definite timing of starting erasing of the data can be determined by the controlling circuit 320. In contrast to the prior art, the prior art controlling circuit cannot know when the data start to be erased, but the present invention controlling circuit 320 overcomes that disadvantage of the prior art. Moreover, please refer to the curve (4) in FIG. 4, because the word line 362 is not selected, the voltage of the word line 362 still maintain a high voltage after the time T1 such that the voltage difference between the substrate and the word line 362 is not sufficiently high. So the memory cells coupled to the word line 362 will not be erased. Here, the voltages of the dummy word line 371 and 372 still correspond to 20V, so the erasing operation is not disturbed by these dummy cells.

After a period of time, the data stored in the memory cells are almost erased (step 506). At this time, the system 300 goes into a discharge procedure. At the time T2, the controlling circuit 320 discharges P-well first and then connect word lines 352 and 362 to ground to make sure no other cell will be disturbed. The controlling circuit 320 also controls the global driving circuits 350 and 360 to correspond to the ground voltage 0V. In addition, the controlling circuit 320 controls the substrate driving circuit 340 to discharge the voltages of the substrate. In this embodiment, the controlling circuit 320 controls the P-well driving circuit 341 to couple the P-well region 381 of the substrate to the ground voltage 0V. Furthermore, the controlling circuit 320 controls the N-well driving circuit 342 to float the deep N-well region 382 of the substrate instead of coupling the deep N-well region 382 to the ground voltage 0V. As mentioned previously, in the prior art, because the N-well region 382 and P-well region 381 are both coupled to the ground voltage 0V, the charges between the two well regions cannot be utilized in a next erasing operation. However, in this embodiment, the voltage level of the N-well region 382 is floating instead of being coupled to the ground voltage 0V. Therefore, the N-well region 382 is no longer pulled down to 0V; there are still charges between the P-well region 381 and the N-well region 382. Moreover, these charges can be utilized in the next erasing procedure.

Please note, in the discharge procedure, the dummy word line 371 and 372 are not pulled down. That is, the dummy cell word line 371 and 372 maintain their voltage level as 20V. At this time, the voltage difference between the dummy word lines 371/372 and the substrate may reach 20V. In addition, the control gates of the dummy cells are coupled to the dummy word line 371 or the dummy word line 372. Therefore, it seems that a "soft" programming procedure is performed on the dummy cells. In contrast to the prior art, the prior art method requires an extra bit of time for programming the dummy cells, but the present invention can directly perform the soft programming procedure on the dummy cells. The present invention can obviously save time and power as compared to the approach of the prior art.

Lastly, after the soft programming procedure is completed (step 508), the controlling circuit 320 controls the dummy word line driving circuit 360 to couple the dummy word lines 371 and 372 to the ground voltage 0V at the time T3. As shown in FIG. 4, at the time T4, all voltages are again discharged to correspond to 0V. The erasing procedure is completely performed (step 510). Then, the flash memory block can be then read, written (programmed), or erased (for example, erasing other memory cells of another word line).

Please note that the present invention does not limit the voltage levels as 20V, 5V, and 0V. In other words, those skilled in the art can select needed voltage levels as long as the erasing procedure can be performed correctly. For example, as long as the erase voltage is sufficiently high to trigger the erasing procedure, any selected voltage levels can be utilized. The voltage levels 20V, 5V, 0V are only utilized as a preferred embodiment and not as a limitation.

Furthermore, please note, the system 300 only shows one memory block and related driving circuits for simplicity. In the actual implementation, one flash memory comprises a plurality of memory blocks and surely, more related circuits. Those skilled in the art should know the concept of the present invention according to the above disclosure. Therefore, the further illustration is omitted here.

In contrast to the prior art, the present invention can determine the definite time of erasing the flash memory, save power for a next erasing procedure, and save time and power to program the dummy cells. Therefore, the present invention undoubtedly has more advantages than the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for erasing data of a non-volatile semiconductor memory, the non-volatile semiconductor memory comprising a plurality of memory cells coupled to a plurality of word lines respectively, each of the memory cells having a substrate, an isolated carrier storage layer, and a control gate disposed over and insulated from said carrier storage layer and coupled to the respective word line, the method comprising:

coupling the substrate to a first voltage to increase a voltage level of the substrate;

before erasing data, floating the control gate to make a voltage level of the control gate increase with the voltage level of the substrate; and when the voltage level of the substrate reaches a predetermined level, coupling the control gate to a second voltage to discharge charges on the isolated carrier storage layer for erasing data.

2. The method of claim 1, further comprising:

before erasing data, floating all the word lines and then coupling all the substrates of all the substrates of all the memory cells to the first voltage to make voltage levels of the control gates of all the memory cells increase with the voltage levels of the substrates;

and the step of coupling the control gate to the second voltage further comprises:

selecting at least one memory cell to be erased from the plurality of memory cells; and coupling the control gate of the selected memory cell to the second voltage via the word line corresponding to the selected memory cell to discharge charges stored in the selected memory cell for erasing data.

3. The method of claim 1, wherein the second voltage is a ground voltage.

4. The method of claim 1, wherein the substrate comprises a semiconductor impurity layer of the first conductivity type, a first well region of a semiconductor impurity layer of the second conductivity type being formed on the surface of said semiconductor substrate, and a second well region of a semiconductor impurity layer of the first conductivity type being formed on the surface of said first well region, said semiconductor memory cells being formed on the surface of said second well region, and the step of coupling the substrate to the first voltage further comprises:

coupling the second well region to the first voltage;

coupling the first well region to a third voltage; and after erasing data, coupling the second well region to the second voltage and floating the first well.

5. The method of claim 4, wherein the third voltage is the first voltage.

6. The method of claim 4, wherein the first well is a deep N-well, and the second well is a P-well.

7. The method of claim 4, wherein the non-volatile semiconductor memory further comprises at least a dummy cell formed in a memory block in which the memory cells are formed to protect the memory cells, the dummy cell has a substrate, an isolated carrier storage layer, and a control gate disposed over and insulated from said carrier storage layer and coupled to a dummy word line, and the method further comprises:

coupling the substrate of the dummy cell to a fourth voltage to increase a voltage level of the substrate of the dummy cell;

before erasing data of the memory cells, coupling the control gate of the dummy cell to a fifth voltage via the dummy word line; and after erasing data of the memory cells, maintaining a voltage level of the control gate of the dummy cell at the fifth voltage for a predetermined period and then coupling the control gate of the dummy cell to the second voltage via the dummy word line;

wherein the dummy cell is not used for storing user data.

8. The method of claim 7, wherein each of the fourth voltage and the fifth voltage is equal to the first voltage.

9. The method of claim 1, wherein the non-volatile semiconductor memory further comprises at least a dummy cell formed in a memory block in which the memory cells are formed to protect the memory cells, the dummy cell has a substrate, an isolated carrier storage layer, and a control gate disposed over and insulated from said carrier storage layer and coupled to a dummy word line, and the method further comprises:
  coupling the substrate of the dummy cell to a third voltage to increase a voltage level of the substrate of the dummy cell;
  before erasing data of the memory cells, coupling the control gate of the dummy cell to a fourth voltage via the dummy word line; and
  after erasing data of the memory cells, maintaining a voltage level of the control gate of the dummy cell at the fourth voltage for a predetermined period and then coupling the control gate of the dummy cell to the second voltage via the dummy word line;
  wherein the dummy cell is not utilized for storing user data.

10. The method of claim 9, wherein each of the third voltage and the fourth voltage is equal to the first voltage.

11. The method of claim 1, wherein the non-volatile semiconductor memory is a flash memory.

12. A method for erasing data of a non-volatile semiconductor memory, the non-volatile semiconductor memory comprising a plurality of memory cells coupled to a word line, each of the memory cells having a substrate, an isolated carrier storage layer, and a control gate disposed over and insulated from said carrier storage layer and coupled to the word line, the substrate comprising a semiconductor impurity layer of a first conductivity type, a first well region of a semiconductor impurity layer of a second conductivity type being formed on the surface of said semiconductor substrate, and a second well region of a semiconductor impurity layer of the first conductivity type being formed on the surface of said first well region, said semiconductor memory cells being formed on the surface of said second well region, and the method comprising:
  coupling the second well region to a first voltage;
  coupling the first well region to a second voltage; and
  after erasing data, coupling the second well region to a third voltage and floating the first well region.

13. The method of claim 12, wherein the second voltage is the first voltage.

14. The method of claim 12, wherein the third voltage is a ground voltage.

15. The method of claim 12, wherein the first well is a deep N-well, and the second well is a P-well.

16. The method of claim 12, wherein the non-volatile semiconductor memory further comprises at least a dummy cell formed in a memory block in which the memory cells are formed to protect the memory cells, the dummy cell has a substrate, an isolated carrier storage layer, and a control gate disposed over and insulated from said carrier storage layer and coupled to a dummy word line, and the method further comprises:
  coupling the substrate of the dummy cell to a fourth voltage to increase a voltage level of the substrate of the dummy cell;
  before erasing data of the memory cells, coupling the control gate of the dummy cell to a fifth voltage via the dummy word line; and
  after erasing data of the memory cells, maintaining a voltage level of the control gate of the dummy cell at the fifth voltage for a predetermined period and then coupling the control gate of the dummy cell to the second voltage via the dummy word line;
  wherein the dummy cell is not utilized for storing user data.

17. The method of claim 16, wherein each of the fourth voltage and the fifth voltage is equal to the first voltage.

18. The method of claim 12, wherein the non-volatile semiconductor memory is a flash memory.

19. A method for erasing data of a non-volatile semiconductor memory, the non-volatile semiconductor memory comprising a plurality of memory cells, each of the memory cells having a substrate, an isolated carrier storage layer, and a control gate disposed over and insulated from said carrier storage layer and coupled to the word line, the non-volatile semiconductor memory further comprising at least a dummy cell formed in a memory block in which the memory cells are formed, the dummy cell having a substrate, an isolated carrier storage layer, and a control gate disposed over and insulated from said carrier storage layer and coupled to a dummy word line, and the method comprising:
  coupling the substrate of the dummy cell to a first voltage to increase a voltage level of the substrate of the dummy cell;
  before erasing data of the memory cells, coupling the control gate of the dummy cell to a second voltage via the dummy word line; and
  after erasing data of the memory cells, maintaining a voltage level of the control gate of the dummy cell at the second voltage for a predetermined period and then coupling the control gate of the dummy cell to a third voltage via the dummy word line.

20. The method of claim 19, wherein the third voltage is a ground voltage.

21. The method of claim 19, wherein the first voltage is equal to the second voltage.

22. The method of claim 19, wherein the non-volatile semiconductor memory is a flash memory.

23. A system for erasing data of a non-volatile semiconductor memory, wherein the non-volatile semiconductor memory comprises a plurality of memory cells coupled to a word line, each of the memory cells having a substrate, an isolated carrier storage layer, and a control gate disposed over and insulated from said carrier storage layer and coupled to the word line, the system comprising:
  a substrate driving circuit, for controlling a voltage level of the substrate;
  a word line driving circuit, for controlling a voltage level of the control gate; and
  a controlling circuit, coupled to the word line driving circuit and the substrate driving circuit, for controlling the substrate driving circuit to couple the substrate to a first voltage, for disconnecting the word line driving circuit and the word line to float the control gate such that the voltage level of the control gate increase with the voltage level of the substrate before the data begins to be erased, for coupling the word line driving circuit and the word line when the data are being erased, and for controlling the word line driving circuit to couple the control gate to a second voltage via the word line when the voltage level of the substrate reaches a predetermined level, such that charges are discharged to erase data.

24. The system of claim 23, wherein the substrate comprises a semiconductor impurity layer of a first conductivity type, a first well region of a semiconductor impurity layer of a second conductivity type being formed on the surface of said semiconductor substrate, and a second well region of a semiconductor impurity layer of the first conductivity type being formed on the surface of said first well region, said semiconductor memory cells being formed on the surface of said second well region, and the substrate driving circuit comprises:
- a first well driving circuit, coupled to the first well, for controlling a voltage level of the first well of the substrate; and
- a second well driving circuit, coupled to the second well, for controlling a voltage level of the second well of the substrate;
- wherein the controlling circuit further controls the first well driving circuit to couple the first well to the first voltage, controls the second well driving circuit to couple the second well to a third voltage, and controls the second well driving circuit to couple the second well to the second voltage and controls the first well driving circuit to float the first well after erasing data.

25. The system of claim 24, wherein the third voltage is equal to the first voltage.

26. The system of claim 24, wherein the second voltage is a ground voltage.

27. The system of claim 24, wherein the first well is a deep N-well, and second well is a P-well.

28. The system of claim 24, wherein the non-volatile semiconductor memory further comprises at least a dummy cell formed in a memory block in which the memory cells are formed to protect the memory cells, the dummy cell has a substrate, an isolated carrier storage layer, and a control gate disposed over and insulated from said carrier storage layer and coupled to a dummy word line, and the system further comprises:
- a dummy word line driving circuit, coupled to the dummy word line and the controlling circuit, for controlling a voltage level of the dummy word line;
- wherein the controlling circuit controls the substrate driving circuit to couple the substrate of the dummy cell to a fourth voltage to increase a voltage level of the substrate of the dummy cell, controls the dummy word line driving circuit to couple the control gate of the dummy cell to a fifth voltage via the dummy word line, and controls the dummy word line driving circuit to maintain the voltage level of the control gate of the dummy cell at the fifth voltage for a predetermined period and then to couple the control gate of the dummy cell to the second voltage after data of the memory cells are erased;
- wherein the dummy cell is not utilized for storing user data.

29. The system of claim 28, wherein each of the fourth voltage and the fifth voltage is equal to the first voltage.

30. The system of claim 23, wherein the non-volatile semiconductor memory further comprises at least a dummy cell formed in a memory block in which the memory cells are formed to protect the memory cells, the dummy cell has a substrate, an isolated carrier storage layer, and a control gate disposed over and insulated from said carrier storage layer and coupled to a dummy word line, and the system further comprises:
- a dummy word line driving circuit, coupled to the dummy word line and the controlling circuit, for controlling a voltage level of the dummy word line;
- wherein the controlling circuit controls the substrate driving circuit to couple the substrate of the dummy cell to a third voltage to increase a voltage level of the substrate of the dummy cell, controls the dummy word line driving circuit to couple the control gate of the dummy cell to a fourth voltage via the dummy word line, and controls the dummy word line driving circuit to maintain the voltage level of the control gate of the dummy cell at the fourth voltage for a predetermined period and then to couple the control gate of the dummy cell to the second voltage after data of the memory cells are erased.

31. The system of claim 30, wherein each of the third voltage and the fourth voltage is equal to the first voltage.

32. The system of claim 30, wherein the non-volatile semiconductor memory is a flash memory.

33. A system for erasing data of a non-volatile semiconductor memory, wherein the non-volatile semiconductor memory comprises a plurality of memory cells coupled to a word line, each of the memory cells having a substrate, an isolated carrier storage layer, and a control gate disposed over and insulated from and coupled to the word line, the substrate comprising a semiconductor impurity layer of the first conductivity type, a first well region of a semiconductor impurity layer of the second conductivity type being formed on the surface of said semiconductor substrate, and a second well region of a semiconductor impurity layer of the first conductivity type being formed on the surface of said first well region, said semiconductor memory cells being formed on the surface of said second well region, and the system comprising:
- a substrate driving circuit comprising:
  - a first well driving circuit, coupled to the first well region, for controlling a voltage level of the first well region of the substrate; and
  - a second well driving circuit, coupled to the second well region, for controlling a voltage level of the second well region of the substrate; and
- a controlling circuit, coupled to the first well driving circuit and the second well driving circuit, for controlling the first well driving circuit to couple the first well to a first voltage, for controlling the second well driving circuit to couple the second well to a second voltage, and for controlling the second well driving circuit to couple the second well to a third voltage and controlling the first well driving circuit to float the first well after erasing data.

34. The system of claim 33, wherein the third voltage is a ground voltage.

35. The system of claim 33, wherein the second voltage is equal to the first voltage.

36. The system of claim 33, wherein the first well is a deep N-well, and second well is a P-well.

37. The system of claim 33, wherein the non-volatile semiconductor memory further comprises at least a dummy cell formed in a memory block in which the memory cells are formed to protect the memory cells, the dummy cell has a substrate, an isolated carrier storage layer, and a control gate disposed over and insulated from said carrier storage layer and coupled to a dummy word line, and the system further comprises:
- a dummy word line driving circuit, coupled to the dummy word line, for controlling a voltage level of the dummy word line;
- wherein the controlling circuit further controls the substrate driving circuit to couple the substrate of the dummy cell to a fourth voltage to increase a voltage level of the substrate of the dummy cell, controls the dummy word line driving circuit to couple the control gate of the dummy cell to a fifth voltage via the dummy word line, and controls the dummy word line driving circuit to maintain the voltage level of the control gate of the dummy cell at the fifth voltage for a predetermined period and then to couple the control gate of the dummy cell to the third voltage after data of the memory cells are erased.

38. The system of claim 37, wherein each of the fourth voltage and the fifth voltage is equal to the first voltage.

39. The system of claim 33, wherein the non-volatile semiconductor memory is a flash memory.

40. A system for erasing data of a non-volatile semiconductor memory, wherein the non-volatile semiconductor memory comprises a plurality of memory cells, and at least a dummy cell formed in a memory block in which the memory cells are formed to protect the memory cells, the dummy cell having a substrate, an isolated carrier storage layer, and a control gate disposed over and insulated from said carrier storage layer and coupled to the dummy word line, the system comprising:

a substrate driving circuit for controlling a voltage level of the substrate;

a dummy word line driving circuit, coupled to the dummy word line, for controlling a voltage level of the dummy word line; and a controlling circuit, coupled to the substrate driving circuit and the dummy word line driving circuit, for controlling the substrate driving circuit to couple the substrate of the dummy cell to a first voltage to increase a voltage level of the substrate of the dummy cell, controlling the dummy word line driving circuit to couple the control gate of the dummy cell to a second voltage via the dummy word line, and controlling the dummy word line driving circuit to maintain the voltage level of the control gate of the dummy cell at the second voltage for a predetermined period and then to couple the control gate of the dummy cell to a third voltage after data of the memory cells are erased;

wherein the dummy cell is not utilized for storing user data.

41. The system of claim 40, wherein the third voltage is a ground voltage.

42. The system of claim 40, wherein the second voltage is equal to the first voltage.

43. The system of claim 40, wherein the non-volatile semiconductor memory is a flash memory.

\* \* \* \* \*